United States Patent
Yoo et al.

(10) Patent No.: US 8,416,311 B2
(45) Date of Patent: Apr. 9, 2013

(54) DIGITAL FILTER, ANALOG-TO-DIGITAL CONVERTER, AND APPLICATIONS THEREOF

(75) Inventors: Kwi Sung Yoo, Seoul (KR); Seog Heon Ham, Suwon-si (KR); Dong Hun Lee, Yongin-si (KR); Min Ho Kwon, Seoul (KR); Wun-Ki Jung, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 511 days.

(21) Appl. No.: 12/656,964

(22) Filed: Feb. 22, 2010

(65) Prior Publication Data

US 2010/0225794 A1  Sep. 9, 2010

(30) Foreign Application Priority Data

Mar. 4, 2009 (KR) .................. 10-2009-0018299

(51) Int. Cl.
*H04N 5/228* (2006.01)
*H04N 3/14* (2006.01)
*H03M 3/00* (2006.01)
*H03M 1/12* (2006.01)

(52) U.S. Cl.
USPC ......... 348/222.1; 348/294; 341/143; 341/155

(58) Field of Classification Search ............... 348/222.1, 348/294; 341/126, 155, 165, 143
See application file for complete search history.

(56) References Cited

U.S. PATENT DOCUMENTS

| | | | | |
|---|---|---|---|---|
| 4,125,900 | A * | 11/1978 | Betts | 708/320 |
| 5,187,482 | A * | 2/1993 | Tiemann et al. | 341/166 |
| 5,923,273 | A * | 7/1999 | Pastorello | 341/143 |
| 6,061,009 | A | 5/2000 | Krone et al. | |
| 6,445,320 | B1 * | 9/2002 | Noro et al. | 341/155 |
| 6,489,913 | B1 * | 12/2002 | Hansen et al. | 341/143 |
| 7,088,279 | B2 | 8/2006 | Muramatsu et al. | |
| 7,129,883 | B2 | 10/2006 | Muramatsu et al. | |
| 7,227,570 | B2 * | 6/2007 | Sato et al. | 348/222.1 |
| 2008/0111059 | A1 | 5/2008 | Lee et al. | |

FOREIGN PATENT DOCUMENTS

| | | |
|---|---|---|
| JP | 02-095025 | 4/1990 |
| JP | 06-303143 | 10/1994 |
| KR | 10-2008-0080916 | 9/2008 |

* cited by examiner

*Primary Examiner* — Nhan T Tran
(74) *Attorney, Agent, or Firm* — Harness, Dickey & Pierce, P.L.C.

(57) ABSTRACT

In one embodiment, the ADC includes a modulator configured to generate a symbol sequence, an operand generator configured to generate operands, and a selector configured to selectively output at least one of (1) a reference value and (2) at least one of the operands based on the symbol sequence. The ADC further includes an accumulator configured to accumulate output from the selector.

33 Claims, 13 Drawing Sheets

DIGITAL FILTER, ANALOG-TO-DIGITAL CONVERTER, AND APPLICATIONS THEREOF

CROSS-REFERENCE TO RELATED APPLICATIONS

This application claims the benefit of priority under 35 U.S.C. §119 to Korean Patent Application No. 10-2009-0018299, filed on Mar. 4, 2009, in the Korean Intellectual Property Office, the entire contents of which is incorporated herein by reference

BACKGROUND

1. Field

The present invention relates to the fields of digital filtering and analog-to-digital conversion.

2. Description of the Related Art

Generally, the sampling rate that is required to sample an analog signal for A/D conversion must be twice the highest frequency component being sampled. This rate is known as the Nyquist rate. More recently, oversampling methods have been utilized for A/D and D/A conversion. In an oversampling type of convertor, the sampling rate is much higher than the Nyquist rate.

With converters operating under the Nyquist rate for sampling, a certain amount of precision is required for the conversion. For example, in converting an analog signal into a 16-bit digital format, 16-bit precision is required. Accordingly, circuits will need to be designed having components which will meet this precision. In many instances, closely trimmed circuit components or precision matching (or compensating) circuits are required to meet the precision.

However, when sampling at a rate much higher than the required Nyquist sampling rate, the oversampling technique permits circuit precision to be relaxed significantly. For example, an A/D oversampling converter implements an oversampling modulator, and the modulator output can be a single bit output. Accordingly, the circuit precision needs only to meet this 1-bit output, and closely trimmed circuit components are generally not needed. Additionally, 1-bit precision can be readily met by current CMOS (complementary-metal-oxide-semiconductor) components.

If the oversampling technique is adopted, the output generally needs to be reduced at the eventual output of the converter. That is, the higher sampling rate is usually returned to the Nyquist rate. In the above example, a multiple number of the 1-bit outputs will need to be combined to form a single output (e.g., 16-bit, 32-bit, etc.). The oversampling technique is preferred in many applications, since the cost savings in using less precise circuit components outweigh the additional digital signal processing needed at the back end of the converter.

One type of oversampling A/D conversion uses a modulator commonly referred to as a delta-sigma modulator. Delta-sigma modulation is a method for encoding high-resolution signals into lower-resolution signals using pulse-density modulation. In an A/D converter (ADC) using a delta-sigma modulator, an integrator and a comparator are utilized at the front end of the converter to provide the quantization of the analog signal. Then, a digital filter is utilized for digital signal processing to provide a corresponding digital signal at the Nyquist rate.

Conventionally, the digital filter includes several accumulators connected in series. If the number of accumulators is N, this series connection of N accumulators is referenced to as Nth order cascaded accumulators. This results in a large size, and consumes a large amount of chip real estate. When applied to certain devices, such as an image sensor, the consumption is magnified because each column of pixels includes at least one ADC having the digital filter.

SUMMARY

One or more embodiments relates to analog-to-digital conversion.

Associated with this, one or more embodiments are also related to digital filtering and a digital filter. The digital filter may be used in an analog-to-digital converter.

In one embodiment, the digital filter includes an accumulator and an accumulation value generator. The accumulation value generator is configured to generate an accumulation value for each symbol position in the symbol sequence, and, for each symbol position, the accumulation value generator is configured to selectively output the accumulation value for the symbol position to the accumulator based on the symbol of the symbol sequence in the symbol position. The accumulator accumulates output from the accumulation value generator.

An analog-to-digital converter (ADC) according to an embodiment may include a digital filter according to any of the above-described embodiments.

In one embodiment, the ADC includes a modulator configured to generate a symbol sequence, an operand generator configured to generate operands, and a selector configured to selectively output at least one of (1) a reference value and (2) at least one of the operands based on the symbol sequence. The ADC further includes an accumulator configured to accumulate output from the selector.

One or more embodiments also relate to an image sensor.

In one embodiment, the image sensor includes a pixel unit array, a row decoder configured to selectively enable output of a row of pixel units in the pixel unit array, and a processing circuit configured to process output from each pixel unit in the enabled row of pixel units. The processing circuit may include an analog-to-digital converter according to any of the above-described embodiments, and/or may include a digital filter according to any of the above-described embodiments.

One or more embodiments still further relate to an image processing system.

In one embodiment, the image processing system includes an image sensor according to one of the above described embodiments, an analog-to-digital converter according to any of the above-described embodiments, and/or may include a digital filter according to any of the above-described embodiments.

The present invention also relates to methods of digital filtering, analog-to-digital conversion, image sensing and/or image processing.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Figure 1:
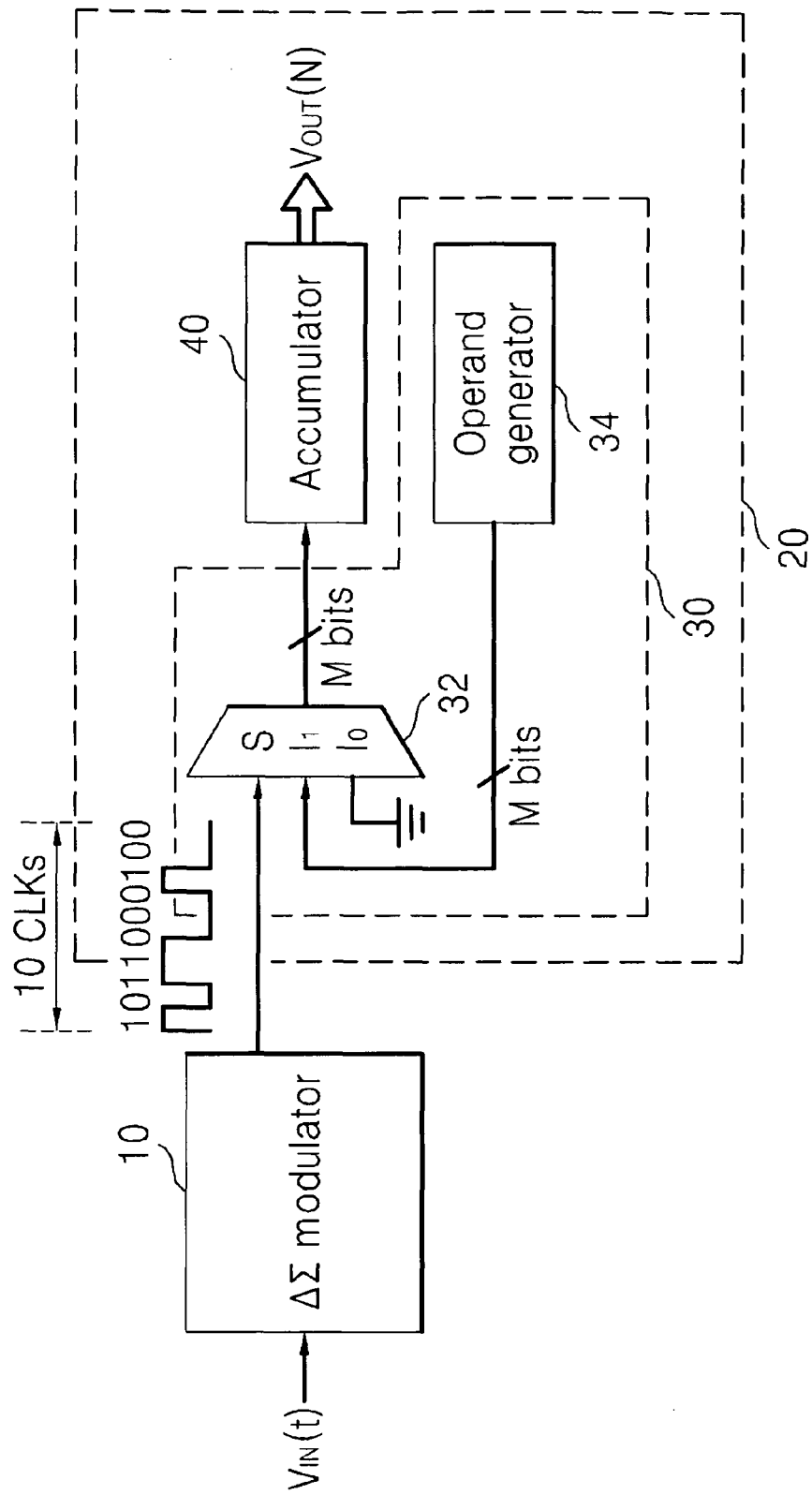
FIG. 1 illustrates an analog-to-digital converter (ADC) according to an embodiment.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an analog-to-digital converter (ADC) according to an embodiment. As shown, the ADC includes a modulator 10 and a digital filter 20. The modulator 10 may be a delta-sigma modulator. The modulator 10 receives an analog signal, and generates a sequence of symbols. Each symbol may be represented by one or more bits in parallel. For example, in a 1-bit system, each symbol is one bit. However, in a 1.5-bit system, each symbols is represented by two bits in parallel. Namely, in a 1.5-bit system, three two bit combinations or pattern's exist to represent three different symbols. In a 2-bit system, two bits in parallel have four different patterns and represent four different possible symbols. Accordingly, a symbol sequence output from the modulator 10 is a number of the symbols that are combined to form a single output (e.g., 16-bit, 32-bit, etc.). Each k-bit output may be generated based on a clock. For the purposes of example only, the embodiment will first be described in detail as generating ten 1-bit outputs over the course of 10 clock pulses, where each bit represents one symbol and the ten 1-bit outputs are combined to form the single output.

The digital filter 20 combines the 1-bit outputs to form the single output. As shown, the digital filter 20 includes an accumulation value generator 30 and an accumulator 40. The accumulation value generator 30 generates accumulation values, and the accumulation values are accumulated by the accumulator 40. As further shown, the accumulation value generator 30 includes a selector 32 and an operand generator 34.

The operand generator 34 in this embodiment generates a sequence of operands for a 1-bit system. Each operand is associated with a position in the symbol sequence, and each operand represents an accumulation value of the associated position. The selector 32 receives the output of the modulator 10 as a control signal, and outputs one of a reference value and the operand from the operand generator 34 based on the control signal. For example, if the modulator 10 outputs a "1", the operand is output from the selector 32, and if the modulator 10 outputs a "0", the reference value is output from the selector 32. The reference value may be zero. Also, the selector 32 may be a multiplexer.

Figure 2:
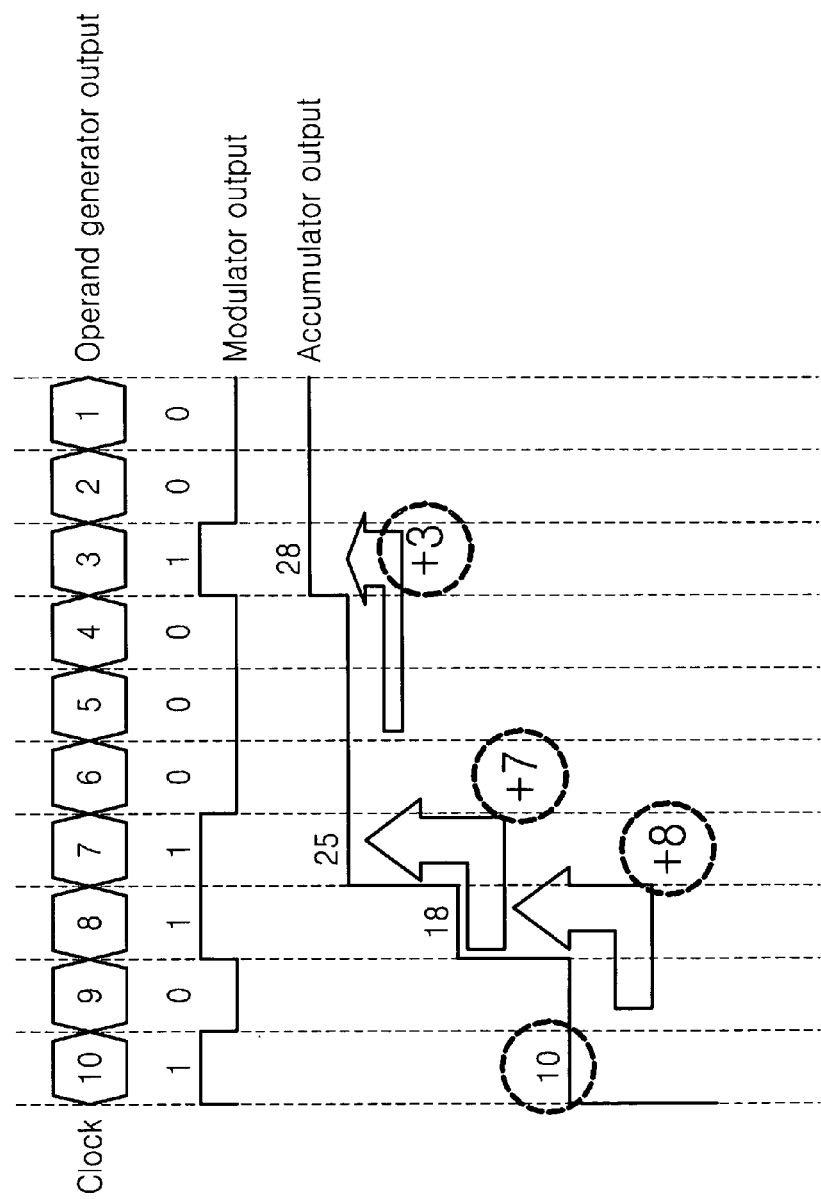
FIG. 2 illustrates example outputs from components in FIG. 1.

Next, the operation of the digital filter 20 will be described in greater detail with reference to FIG. 2. As discussed above, for the purposes of example, assume a 1-bit system where ten 1-bit symbols represent a single output. FIG. 2 shows the ten clocks pulses and an example output from the modulator 10 at each clock pulse. Furthermore, for each clock pulse, FIG. 2 shows the operand generated by the operand generator 20. Finally, FIG. 2 shows the output from the accumulator 40 as well.

In general, the operand represents the affect on accumulation if the 1-bit symbol is "1" and was accumulated by a conventional digital filter employing Nth order cascaded accumulators, where N is greater than or equal to 2. In the example of FIG. 2, if $2^{nd}$ order cascaded accumulators were used, a "1" as the first symbol in the symbol sequence would accumulate to a value of 10. Also in general, the accumulation value for each position in the symbol sequence is a fixed decrement below the accumulation value for the preceding position in the symbol sequence. Accordingly, the operand generator 34 outputs an initial operand in the operand sequence, and decrements the preceding operand by this decrement value to obtain and output the next operand in the sequence.

In the example of FIG. 2, the initial operand is 10 and the decrement is 1. Accordingly, the operand sequence is 10, 9, 8, . . . , 1. As further shown in FIG. 2, the symbol sequence is 1011000100 such that the first, third, fourth, and eighth operands corresponding to those same positions in the symbol sequence are output by the selector 32. A zero (e.g., ground) value is output in association with the second, fifth, sixth, seventh, ninth and tenth positions in the symbol sequence. The accumulator 40 accumulates (e.g., adds) the output of the selector 32. Namely, in the example of FIG. 2, the accumulator 40 adds 10+0+8+7+0+0+0+3+0+0, which equals 28. Stated another way, the accumulation values of the first, third, fourth, and eighth operands are accumulated to generate the single output of the ADC. Accordingly, the total accumulation value output by the single accumulator 40 represents an Nth order cascaded accumulation value, where N is 2 in the example of FIG. 2.

As will be appreciated, this embodiment permits generating an Nth order cascaded accumulation value using a single accumulator. In this embodiment, the use of the operand generator permits replacing the other N−1 accumulators in a conventional Nth order digital filter. This significantly reduces the size of the digital filter and amount of chip real estate devoted to the digital filter. As a result, the size of the ADC is significantly reduced.

Figure 3:
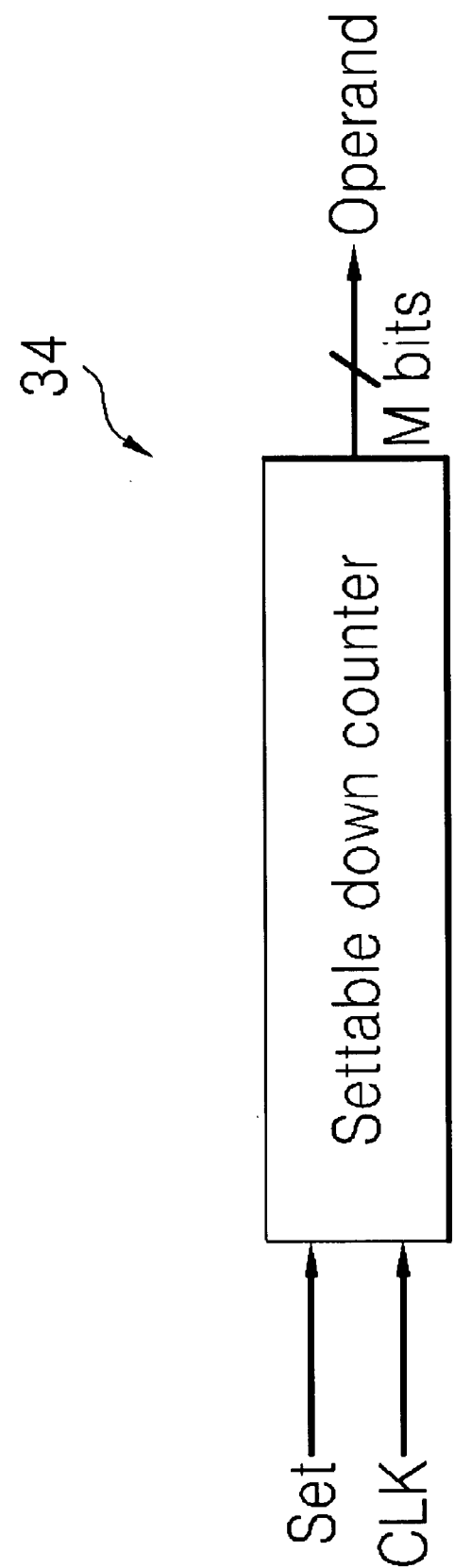
FIG. 3 illustrates an embodiment of the operand generator in FIG. 1.
Figure 5:
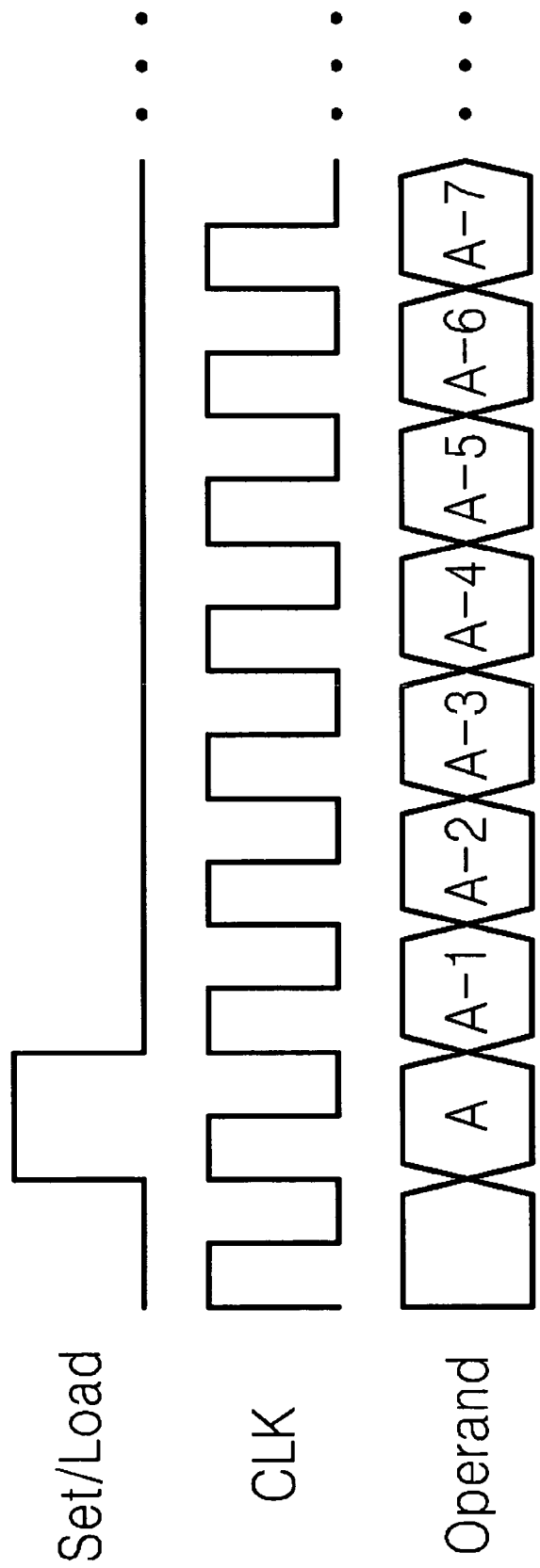
FIG. 5 illustrates example control signals applied to the operand generators of FIGS. 3 and 4.

FIG. 3 illustrates an embodiment of the operand generator in FIG. 2. As shown, the operand generator 34 includes a settable down counter. As shown in FIG. 5, the settable down counter sets to an initial value in response to receipt of a set signal. The initial value is fixed in the settable down counter through programming or design such that the settable down counter sets to the same initial value each time. As shown in FIG. 5, the settable down counter then counts down by a fixed decrement in response to a clock signal. The fixed decrement is also set through programming or design, and is an integer value. The count value output by the settable down counter is the operand.

Figure 4:
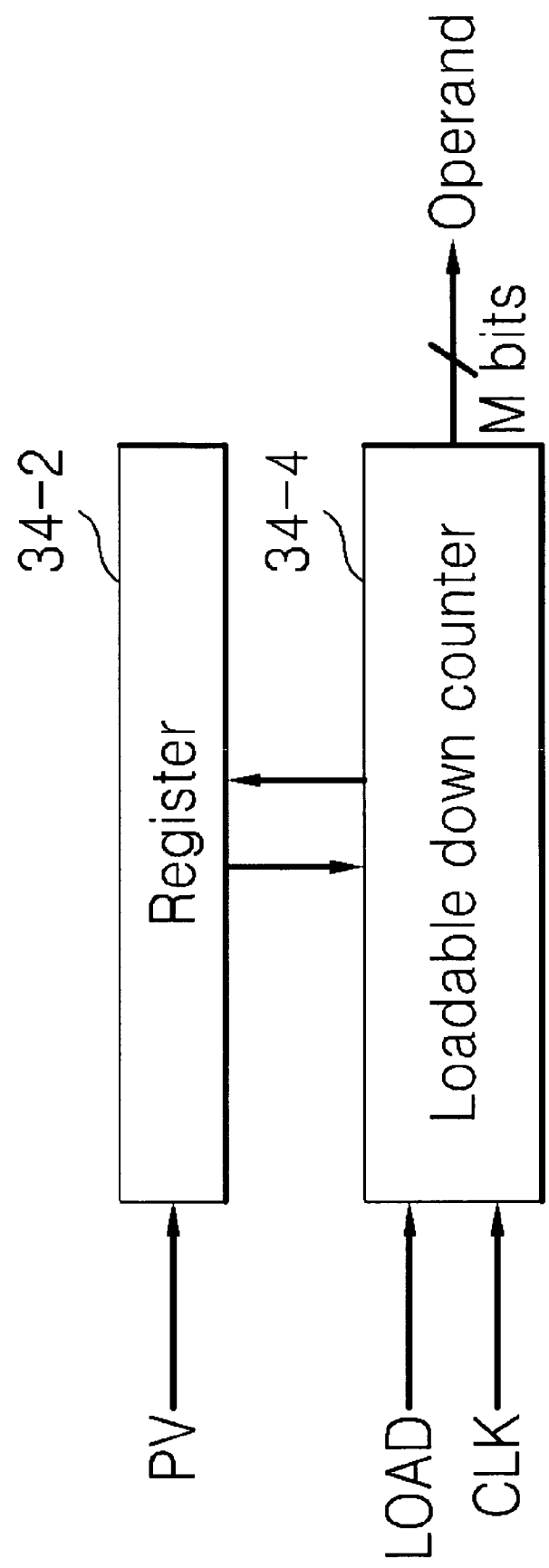
FIG. 4 illustrates an embodiment of the operand generator in FIG. 1.

FIG. 4 illustrates another embodiment of the operand generator in FIG. 2. As shown, the operand generator 34 includes a register 34-2 and a loadable down counter 34-4. The register 34-2 receives and stores a programmable value. As shown in FIG. 5, in response to a load signal, the loadable down counter 34-4 loads the programmable value as the initial value, and counts down from the initial value in response to a clock signal. The loadable down counter 34-4 then counts down by a fixed decrement in response to a clock signal. The fixed decrement is also set through programming or design, and is an integer value. The count value output by the loadable down counter 34-4 is the operand. In this manner, the initial operand value may be programmable.

Figure 6:
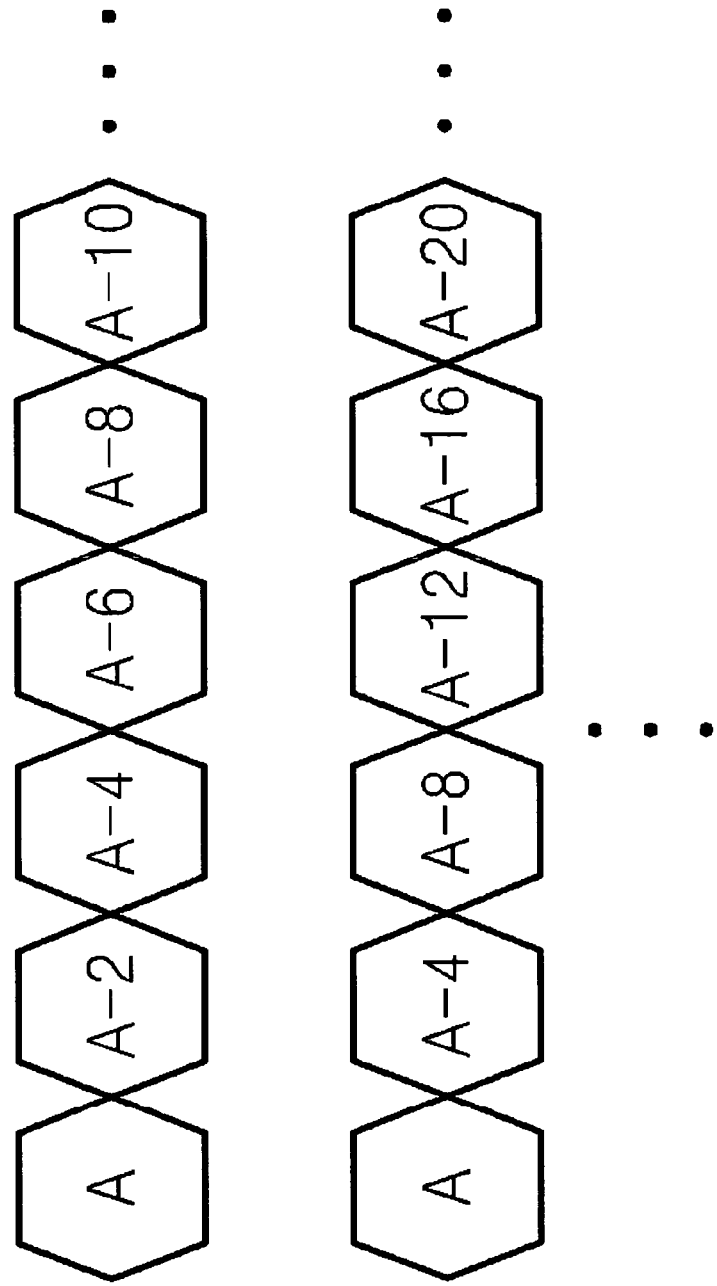
FIG. 6 illustrates example output from the operand generator of FIG. 1.

It will further be appreciated that in addition to or instead of the initial value being programmable, the decrement value may be programmable. FIG. 6 illustrates two examples of operand sequences with different decrement values. In the first operand sequence, the decrement value is 2; and in the second operand sequence, the decrement value is 4.

Figure 7:
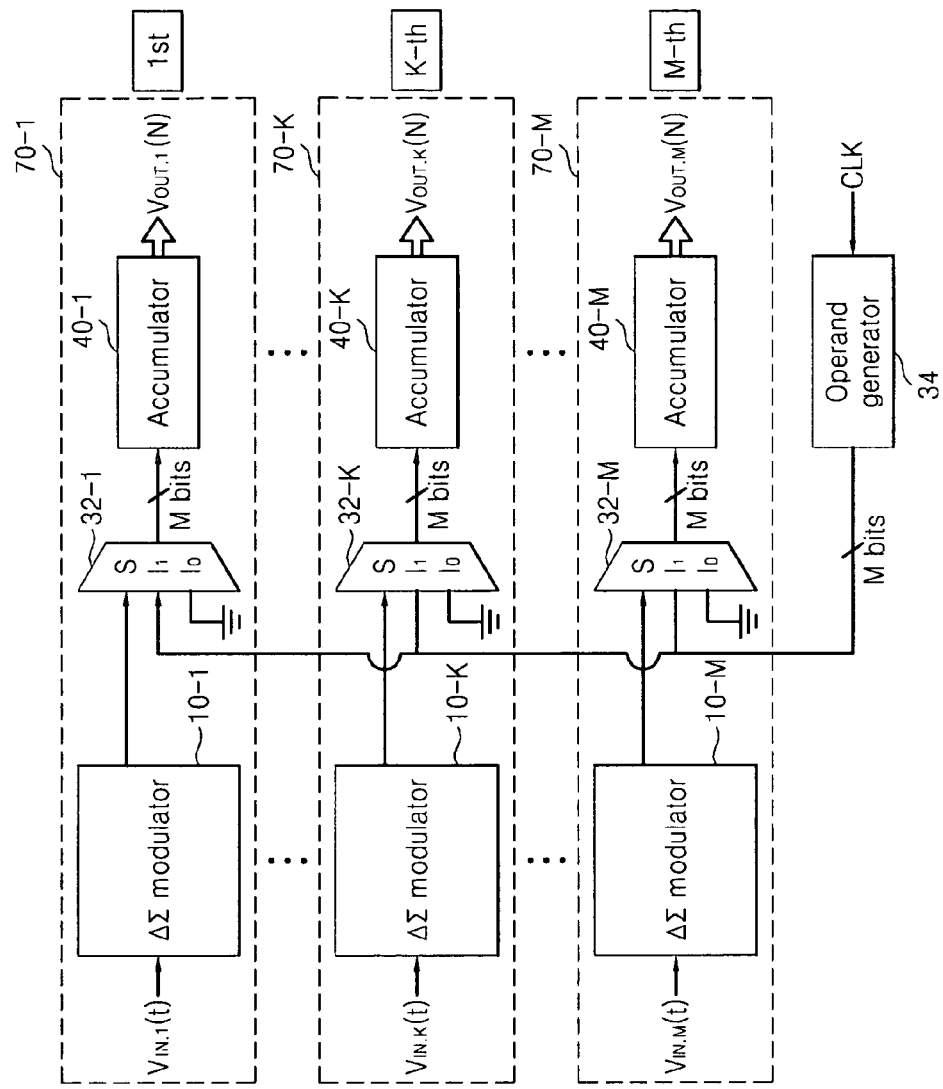
FIG. 7 illustrates application of a single operand generator to multiple ADCs.

FIG. 7 illustrates use of a single operand generator for several digital filters. Many devices, such as an image sensor, employ multiple ADCs. FIG. 7 illustrates M ADCs 70, where M is an integer greater than 1. Each of the M ADCs 70 has the same structure, and the structure is the same as the ADC of FIG. 2 except that the M ADCs 70 share a single operand generator 34. Because the structure and function of the ADCs 70 is the same as described above with respect to FIG. 2, except for the above noted difference, a detailed description of this function and structure will not be repeated for the sake of brevity. As will be appreciated, the embodiment of FIG. 7, further reduces the size of the device by replacing the N×M accumulators of conventional Nth order cascaded accumulator based ADCs with M accumulators and one operand generator.

Figure 8:
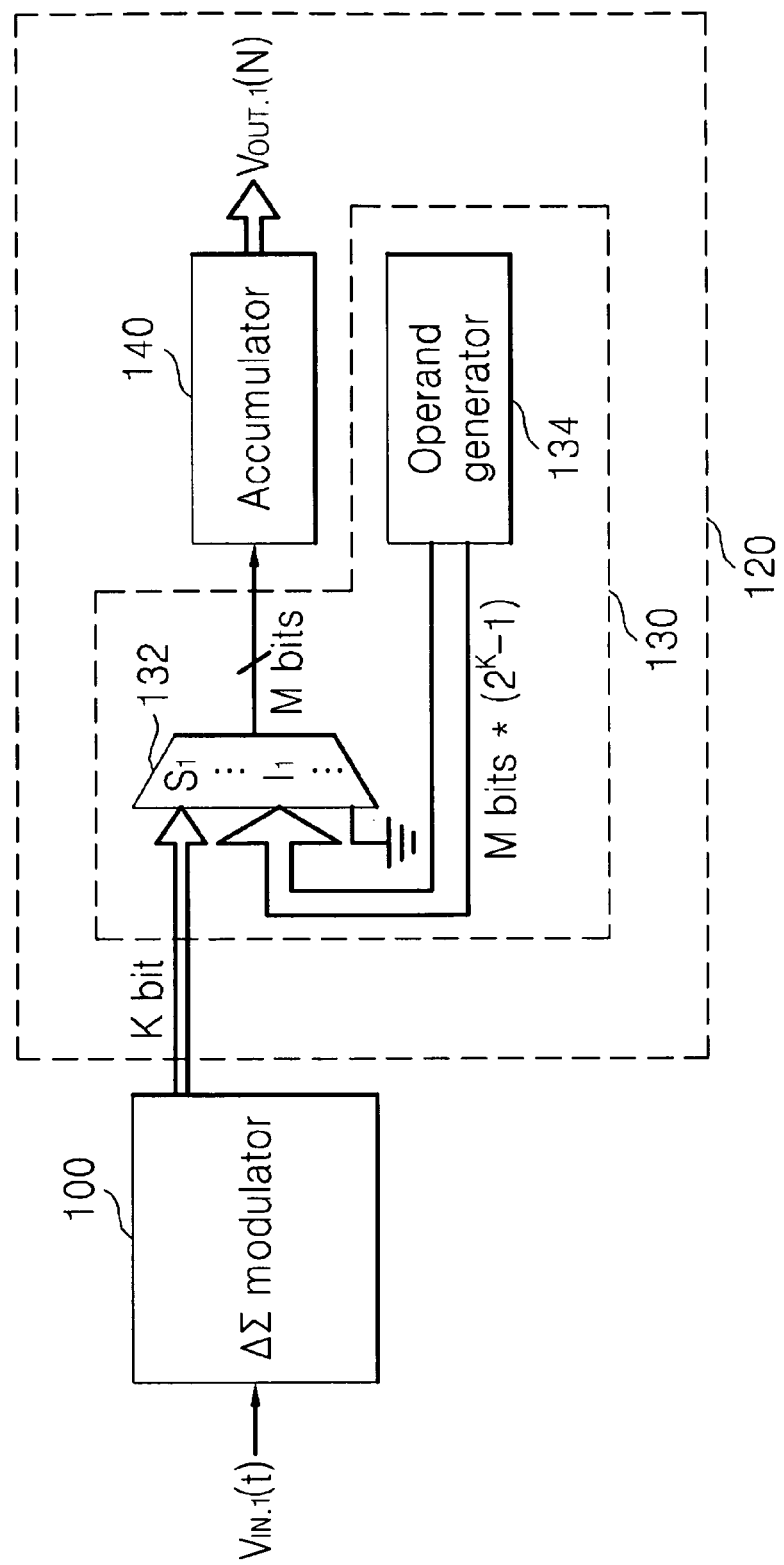
FIG. 8 illustrates an ADC according to another embodiment.

While the above embodiments have been described with respect to a 1-bit system, the inventive concepts are not limited to a 1-bit system. Instead, as alluded to above, the inventive concepts are also applicable to a 1.5-bit system, a 2-bit system, a 3-bit system, etc., where each symbol includes 2 bits, 2 bits, 3 bits, etc. FIG. 8 illustrates an embodiment of an ADC employing a multi-bit system. As shown, the modulator 100 receives an analog signal, and generates a sequence of symbols. The modulator 100 may be a delta-sigma modulator. Each symbol may be represented by K bits in parallel. For example, in a 1-bit system, each symbol is one bit. However, in a 1.5-bit system, each symbol is represented by two bits in parallel. Namely, in a 1.5-bit system three two bit combinations or patterns exist to represent three different symbols. In a 2-bit system, two bits in parallel have four different patterns and represent four different possible symbols. Accordingly, a symbol sequence output from the modulator 100 is a number of the symbols that are combined to form a single output (e.g., 16-bit, 32-bit, etc.). Each K-bit output may be generated based on a clock. The digital filter 120 combines a sequence of the K-bit outputs to form the single output. As shown, the digital filter 120 includes an accumulation value generator 130 and an accumulator 140. The accumulation value generator 130 generates accumulation values, and the accumulation values are accumulated by the accumulator 140. As further shown, the accumulation value generator 130 includes a selector 132 and an operand generator 134.

The operand generator 134 in this embodiment generates (X−1) operand sequences, where X is a number of different possible symbols in the symbol sequence, such that the reference value and each of the (X−1) operand sequences corresponds to a different one of the different possible symbols. Stated another way, X is the number of different potential bit patterns in the multi-bit system. For example, for a 1.5-bit system with 3 different potential bit patterns or symbols, the operand generator 134 generates two operand sequences. Each operand in each sequence is associated with a position in the symbol sequence. For example, in 1.5-bit system with two operand sequences, two operands correspond to each position in the symbol sequence.

The selector 132 is configured to output one of an operand from one of the (X−1) operand sequences and the reference value based on a received symbol in the symbol sequence. Namely, the K parallel bits representing each symbol serve as a control signal that controls the selection performed by the selector 132. The selector 132 may be a multiplexer. As will be appreciated from the above, the operands in the operand sequences represent the accumulation value for that position and an associated one of the symbols.

Figure 9:
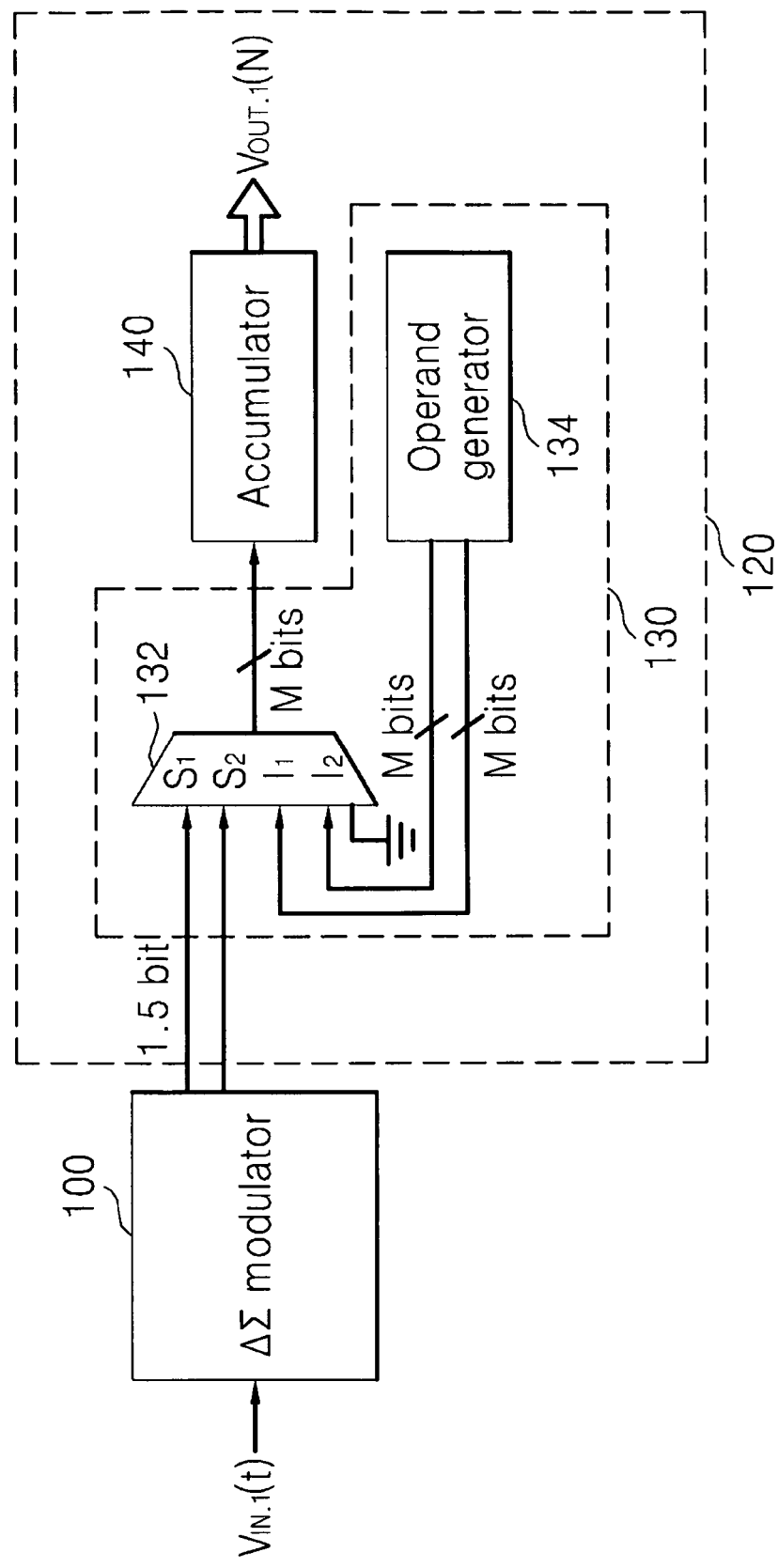
FIG. 9 illustrates the ADC of FIG. 8 for a 1.5-bit system.

The operation of the embodiment of FIG. 8 will now be described in more detail with respect to a 1.5-bit system. FIG. 9 illustrates the embodiment of FIG. 8 for a 1.5-bit system. Accordingly, as shown, the modulator 100 generates two bits S1 and S2 in parallel to represent each symbol. The 2 bits may have one of three different potential patterns (00, 01 and 10), and thus may represent three different symbols. Also, the operand generator 134 generates to operand sequences I1 and I2. The first operand sequence I1 corresponds to the symbol "01", and the second operand sequence I2 corresponds to the symbol "10". As a result, the selector 132 selects the operand in the second operand sequence I2 if the symbol "10" is received, and selects the operand in, the first operand sequence I1 if the symbol "01" is received. The selector 132 also selects the reference value (e.g., ground or zero in this embodiment) if the symbol "00" is received.

Figure 10:
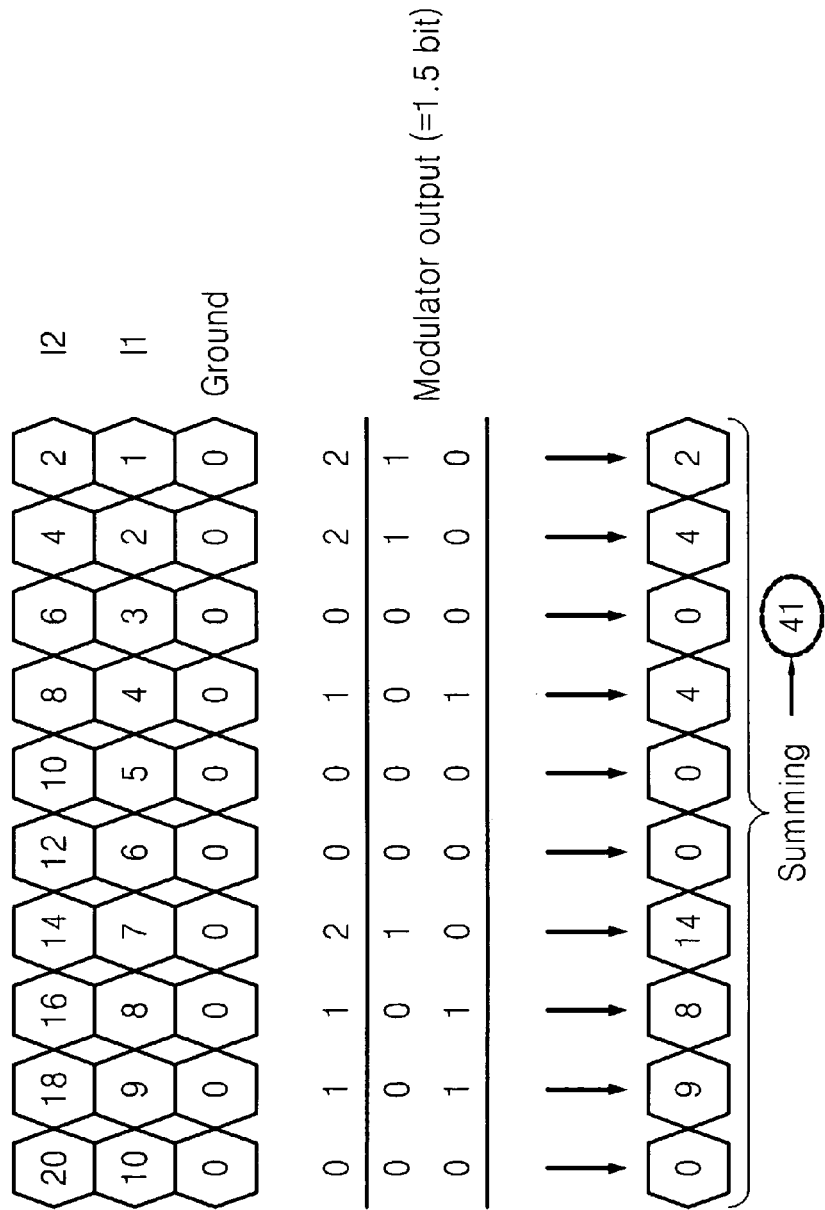
FIG. 10 illustrates example outputs from components in FIG. 9.

FIG. 10 illustrates an example ten clocks pulses forming a symbol sequence and an example output from the modulator 100 at each clock pulse. Furthermore, for each clock pulse, FIG. 10 shows the first and second operand sequences I1 and I2 generated by the operand generator 120. Finally, FIG. 10 shows the final output from the accumulator 140 as well.

In general, the operand in the second operand sequence I2 represents the affect on accumulation if the 2-bit symbol is "10" and was accumulated by a convention digital filter employing Nth order cascaded accumulators, where N is greater than or equal to 2. In the example of FIG. 10, if $2^{nd}$ order cascaded accumulators were used, a "10" as the first symbol in the symbol sequence would accumulate to a value of 20. The operand in the first operand sequence I1 represents the affect on accumulation if the 2-bit symbol is "01" and was accumulated by a convention digital filter employing Nth order cascaded accumulators, where N is greater than or equal to 2. In the example of FIG. 10, if $2^{nd}$ order cascaded accumulators were used, a "01" as the first symbol in the symbol sequence would accumulate to a value of 10. Also in general, the accumulation value for each position in the symbol sequence is a fixed decrement below the accumulation value for the preceding position in the symbol sequence. Accordingly, the operand generator 34 outputs an initial operand in the operand sequence, and decrements the preceding operand by this decrement value to obtain and output the next operand in the sequence. For the second operand sequence I2, the decrement is 2, and for the first operand sequence I1, the decrement is 1.

As will be appreciated, in a multi-bit system, the accumulation value of an operand in an Pth operand sequence is greater than the accumulation value of an operand at a same position in an (P−1)th operand sequence, where P is less than or equal to X−1.

As further shown in FIG. 10, the symbol sequence is 00,01, 01,10,00,00,01,00,10,10 such that: (1) the fourth, ninth and tenth operands in the second operand sequence I2 corresponding to those same positions in the symbol sequence are output by the selector 132; (2) the second, third, and seventh operands in the first operand sequence I1 corresponding to those same positions in the symbol sequence are output by the selector 132; and (3) a zero (e.g., ground) value is output in association with first, fifth, sixth and eighth positions in the symbol sequence. The accumulator 140 accumulates (e.g., adds) the output of the selector 132. Namely, in the example of FIG. 10, the accumulator 40 adds 0+9+8+14+0+0+4+0+ 4+2, which equals 41. The total accumulation value output by the single accumulator 140 represents an Nth order cascaded accumulation value for a 1.5-bit system, where N is 2 in the example of FIG. 10.

As will be appreciated, this embodiment permits generating an Nth order cascaded accumulation value in a multi-bit system using a single accumulator. The use of the operand generator permits replacing the other N−1 accumulators in a conventional Nth order digital filter. This significantly reduces the size of the digital filter and amount of chip real estate devoted to the digital filter. As a result, the size of the ADC is significantly reduced.

The operand generator 134 of FIG. 8 may also be embodied according to the embodiments of FIGS. 3 and 4. With respect to FIG. 3, the operand generator 134 may include a settable down counter for each operand sequence. With respect to FIG. 4, the operand generator 134 may include a register and loadable down counter for each operand sequence. Accordingly, it will be appreciated that the initial value and/or decrement for each operand sequence is programmable.

Also, in devices employing a plurality of ADCs operating according to a same multi-bit system, a single operand generator 134 may be shared across the ADCs as illustrated with respect to FIG. 7.

While the embodiment of FIG. 8 was described in detail with respect to a 1.5-bit system, it will be appreciated that this embodiment is applicable to any multi-bit system. For example, the operand generator in 2-bit system will generate 3 operand sequences. With respect to the example operand sequences in FIG. 10, the third operand sequence I3 would be 30, 27, 24, 21, 18, 15, 12, 9, 6, 3, for the ten symbol positions of the symbol sequence.

Figure 11:
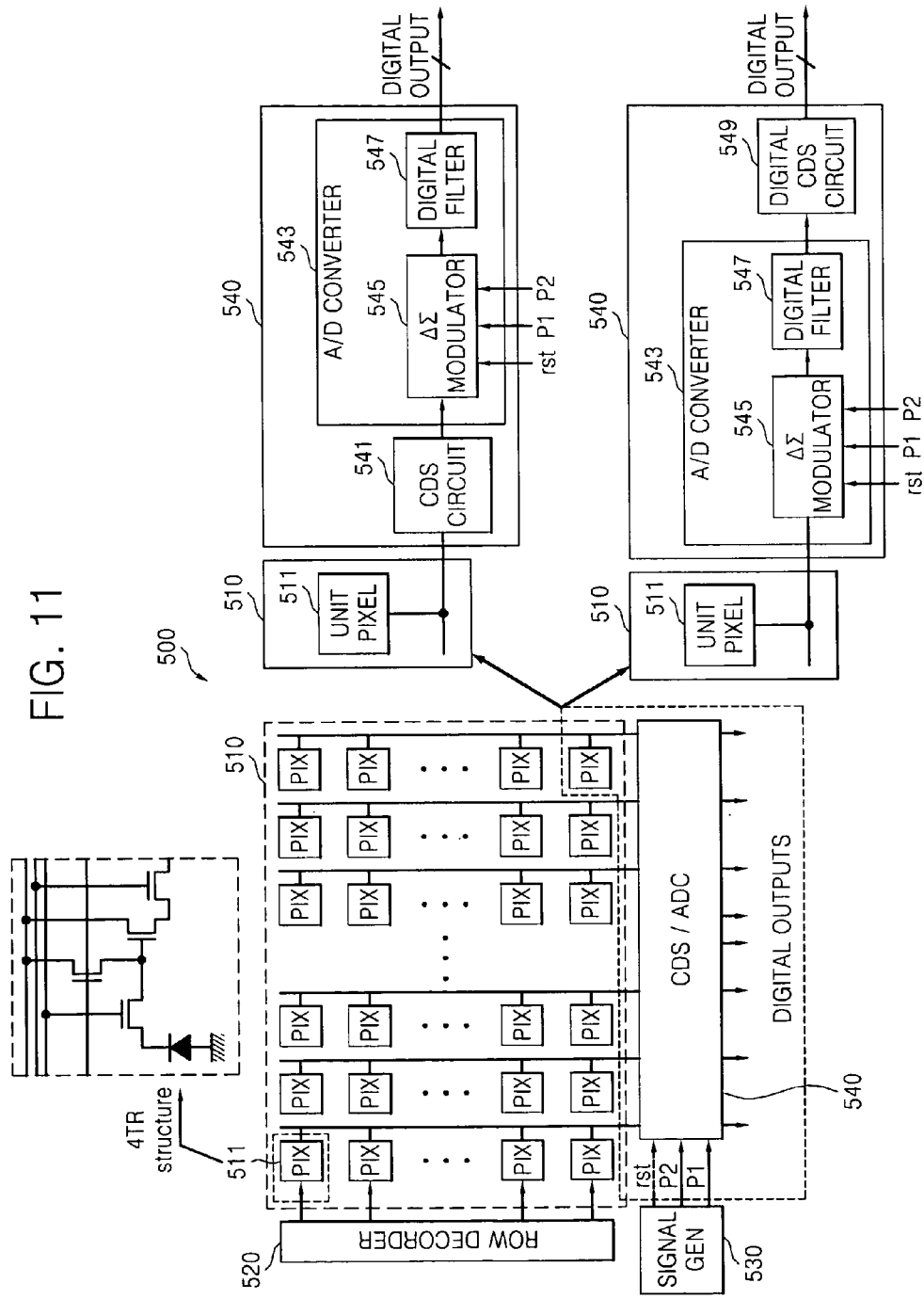
FIG. 11 illustrates an image sensor according to an embodiment.

FIG. 11 illustrates a C-MOS image sensor according to an embodiment. As shown, the C-MOS image sensor includes a pixel array 510. The pixel array 510 includes unit pixels 511 arranged in rows and columns. Each of the unit pixels 511 may have the conventional 4 transistor (4TR) structure shown in FIG. 11. A row decoder 520 selectively enables rows of unit pixels 511 to output. A correlated double sampling (CDS)/ analog-to-digital converter (ADC) 540 receives the output from the unit pixels 511 in a selected row and generates digital outputs based thereon. In one embodiment, the CDS/ADC 540 includes a CDS circuit and an ADC circuit for each column of unit pixels 511. As shown in FIG. 11, in one embodiment a CDS circuit 541 will first process the output of a unit pixel 511 and the ADC circuit 543 may operate on the output of the CDS circuit 541. As alternatively shown in FIG. 11, instead the ADC circuit 543 may operate on the output of the unit pixel 511, and then a digital CDS circuit 549 may operate on the output of the ADC 543.

As further shown in FIG. 11, the ADC circuit 543 includes a delta-sigma modulator 545 and a digital filter 547, with the digital filter 547 filtering the output of the delta-sigma modulator 545. The ADC circuit 543 may be any of the above-described ADC embodiments. Alternatively, the digital filter 547 may be any of the above described digital filter embodiments.

A signal generator 530 supplies, first clock signal P1 and second clock signal P2 to the delta-sigma modulators 545 of the CDS/ADC 540. Optionally, the signal generator 530 may also supply a reset signal.

Figure 12:
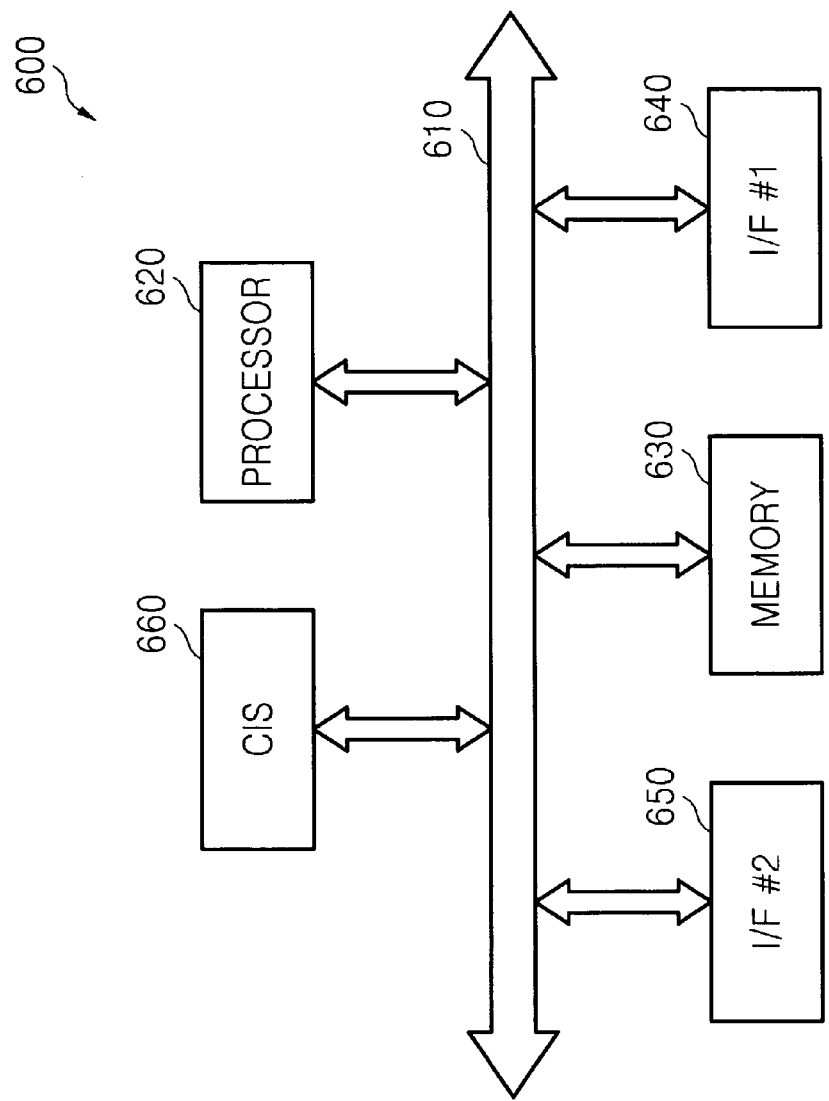
FIG. 12 illustrates an image processing system according to an embodiment.

FIG. 12 illustrates an image processing system according to an embodiment. As shown, a processor 620, a memory 630, a first interface 640, a second interface 650 and a C-MOS image sensor (CIS) 660 are connected to a common bus 610.

The processor 620 controls the operation of the memory 630 and the CIS 660 based on input signals received from a user via the first and second interfaces 640 and 650. For example, the first and second interfaces 640 and 650 may be buttons, toggles, etc. forming part of the image processing system. The memory 630 may be any well-known type of memory such as optical disc, flash memory, hard drive, etc. The CIS 660 may be the CIS described with respect to FIG. 11. However, the CIS may be any CIS that incorporates an ADC and/or a digital filter according to an above-described embodiment.

Various devices, such as image sensors, may use various counting schemes in association with analog-to-digital conversion. For example, digital data sampling (DDS) in many image sensors involves obtaining a difference by up-counting and down-counting. Still further, these up/down counting schemes may employ twos-complement and/or ones complement techniques to improve the overall counting scheme performance. US Patent Publication 2008/0111059 filed Oct. 23, 2007 discloses such schemes for an image sensor, and is hereby incorporated by reference in its entirety. The inventive concepts disclosed herein may be modified compatible with those counting schemes.

Figure 13:
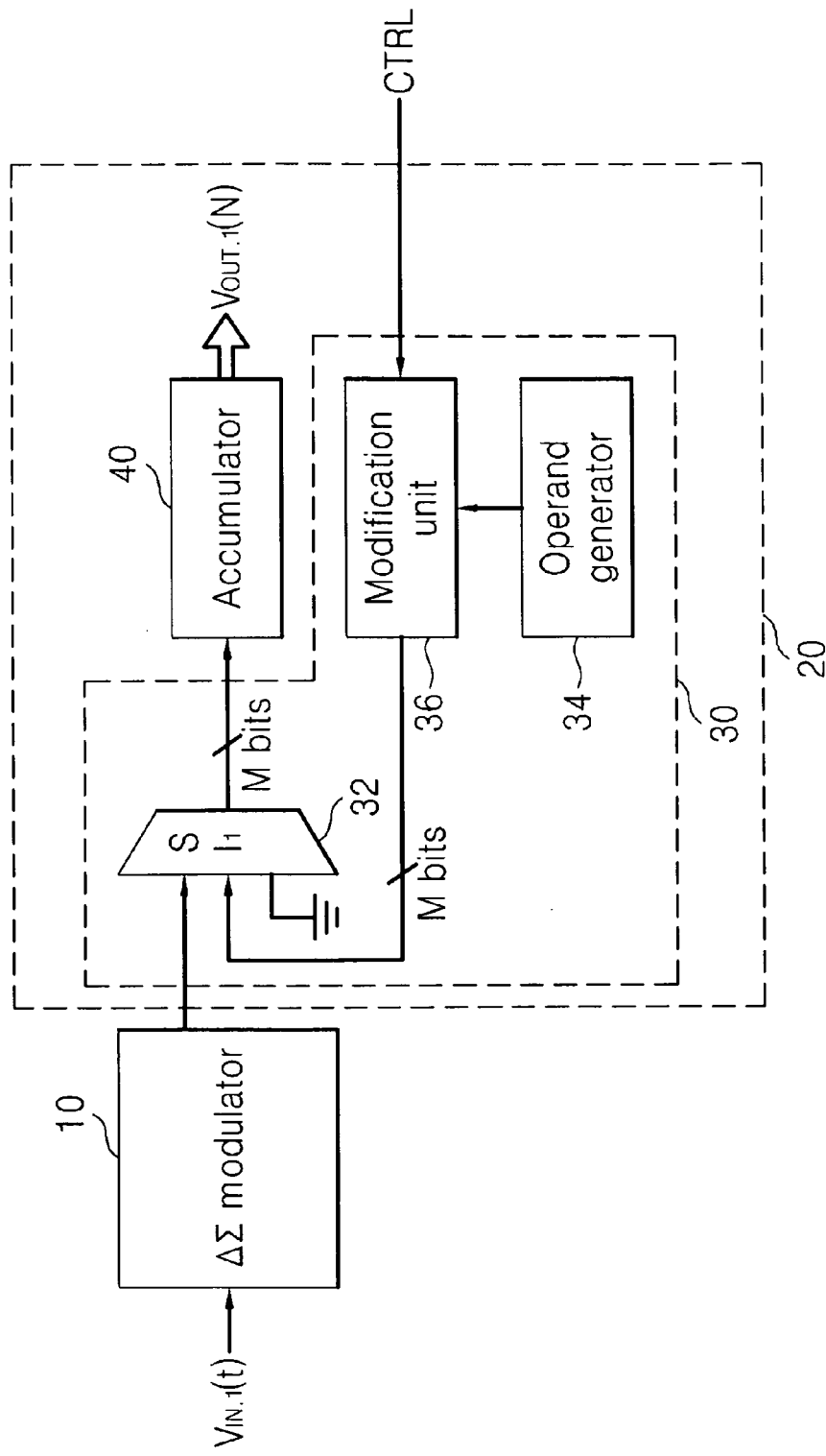
FIG. 13 illustrates an embodiment of an ADC modified compatible with a conventional up/down counting scheme.

For example, FIG. 13 illustrates an embodiment modified compatible with such an up/down counting scheme. As shown, the embodiment of FIG. 13 is the same as the embodiment of FIG. 1, except that a modification unit 36 is disposed between the selector 32 and the operand generator 34. For the sake of brevity, only these differences will be discussed in detail.

The modification unit 36 selectively outputs the operands from the operand generator 34 unmodified or modified based on a control signal. If the control signal indicates to modify the operands, the modification unit 36 modifies the operands consistent with the counting scheme to which the ADC of FIG. 13 is applied.

Assume for the purposes of example, the ADC of FIG. 13 is applied to a scheme that involves up-counting and then down-counting such as discussed in US Patent Publication 2008/0111059. During the up-counting operation, the control signal instructs the modification unit 36 to modify the operands generated by the operand generator 34. For example, the modification unit 36 generates the ones complement of the operands. During the down-counting, the control signal instructs the modification unit 36 to not modify the operands generated by the operand generator 34. The control signal may be generated by a controller in the image sensor controlling the timing of the up and down counting operations. In this manner, the ADC according to the inventive concepts may become compatible with existing counting schemes, and replace conventional ADCs in conventional devices.

While described for a 1-bit system, it will be appreciated that modifying an ADC to be compatible with existing counting schemes is also applicable to multi-bit systems such as illustrated in FIG. 8.

The invention being thus described, it will be obvious that the same may be varied in many ways. Such variations are not to be regarded as a departure from the invention, and all such modifications are intended to be included within the scope of the invention.

What is claimed is:

1. An analog-to-digital converter (ADC), comprising:
a modulator configured to generate a symbol sequence;
an operand generator configured to generate operands;
a selector configured to selectively output at least one of (1) a reference value and (2) at least one of the operands based on the symbol sequence; and
an accumulator configured to accumulate output from the selector,
wherein the operand generator is configured to generate at least one sequence of operands, each operand associated with a position in the symbol sequence, and each operand represents an accumulation value of the associated position, and
wherein a later the position in the symbol sequence, the lower the associated accumulation value.

2. The ADC of claim 1, wherein the operand generator is configured to generate a subsequent operand in the operand sequence by decrementing a previous operand in the operand sequence by a decrement amount, and the operand sequence starts with an initial operand value.

3. The ADC of claim 2, wherein the operand generator is configured such that at least one of the initial operand value and the decrement amount are programmable.

4. The ADC of claim 1, wherein
the selector is configured to output the reference value if a particular symbol of different possible symbols in the symbol sequence is received; and
the selector is configured to output one of the operands if a symbol other than the particular symbol is received.

5. The ADC of claim 4, wherein each symbol in the symbol sequence is represented by a number of bits.

6. The ADC of claim 5, wherein
each symbol in the symbol sequence is represented by one bit; and
the selector outputs the reference value if a received symbol of the symbol sequence is a '0' and outputs an operand of the operand sequence if a received symbol of the symbol sequence is a '1'.

7. The ADC of claim 6, wherein the reference value is zero.

8. The ADC of claim 1, wherein the selector is a multiplexer.

9. The ADC of claim 1, wherein
the operand generator is configured to generate (X−1) operand sequences, where X is a number of different possible symbols in the symbol sequence, such that the reference value and each of the (X−1) operand sequences correspond to a different one of the different possible symbols; and
the selector is configured to output one of an operand from one of the (X−1) operand sequences and the reference value based on a received symbol in the symbol sequence.

10. The ADC of claim 9, wherein the accumulation value of an operand in an Pth operand sequence is greater than the accumulation value of an operand at a same position in an (P−1)th operand sequence, where P is less than or equal to X−1.

11. The ADC of claim 10, wherein the operand generator is configured to store an initial value for at least one of the (X−1) operand sequences, and is configured to generate the operand sequence by counting down from the initial value.

12. The ADC of claim 11, wherein the operand generator is configured such that the initial value is programmable.

13. The ADC of claim 12, wherein the operand generator is configured such that a decrement value used in counting down from the initial value is programmable.

14. The ADC of claim 9, wherein each symbol in the symbol sequence is represented by a number of bits.

15. The ADC of claim 14, wherein each symbol in the symbol sequence is represented by one of three possible two bit patterns.

16. The ADC of claim 15, wherein the selector outputs the reference value if the received symbol of the symbol sequence is represented by a first two bit pattern, outputs an operand of a first operand sequence if the received symbol of the symbol sequence is represented by a second two bit pattern, and outputs an operand of a second operand sequence if the received symbol of the symbol sequence is represented by a third two bit pattern.

17. The ADC of claim 16, wherein the reference value is zero.

18. The ADC of claim 16, wherein
the accumulation value of an operand in the second operand sequence is greater than the accumulation value of an operand at a same position in the first operand sequence;
the accumulation value of a previous operand in the second operand sequence is greater than the accumulation value of a subsequent operand in the second operand sequence; and
the accumulation value of a previous operand in the first operand sequence is greater than the accumulation value of a subsequent operand in the first operand sequence.

19. The ADC of claim 9, wherein each symbol in the symbol sequence is represented by two bits such that four different possible symbols exist and each of the four different possible symbols is represented by a different two bit pattern.

20. The ADC of claim 19, wherein the selector outputs the reference value if the received symbol of the symbol sequence is represented by a first two bit pattern, outputs an operand of a first operand sequence if the received symbol of the symbol sequence is represented by a second two bit pattern, outputs an operand of a second operand sequence if the received symbol of the symbol sequence is represented by a third two bit pattern, and outputs an operand of a third operand sequence if the received symbol of the symbol sequence is represented by a fourth two bit pattern.

21. The ADC of claim 20, wherein the reference value is zero.

22. The ADC of claim 20, wherein
the accumulation value of an operand in the second operand sequence is greater than the accumulation value of an operand at a same position in the first operand sequence;
the accumulation value of an operand in the third operand sequence is greater than the accumulation value of an operand at a same position in the second operand sequence;
the accumulation value of a previous operand in the third operand sequence is greater than the accumulation value of a subsequent operand in the third operand sequence;
the accumulation value of a previous operand in the second operand sequence is greater than the accumulation value of a subsequent operand in the second operand sequence; and
the accumulation value of a previous operand in the first operand sequence is greater than the accumulation value of a subsequent operand in the first operand sequence.

23. The ADC of claim 1, wherein the accumulator generates a total accumulation value representing an Nth order cascaded accumulation value, where N is greater than or equal to 2.

24. The ADC of claim 1, further comprising:
a modification unit configured to selectively modify of output from the operand generator; and wherein
the selector is configured to selectively output one of the reference value and output from the modification unit based on the symbol sequence.

25. The ADC of claim 24, wherein the modification unit is configured to selective generate a ones complement of the output from the operand generator.

26. An analog-to-digital converter (ADC), comprising:
a modulator generating a symbol sequence;
an accumulator;
an accumulation value generator configured to generate at least one sequence of operands, each operand representing an accumulation value for each symbol position in the symbol sequence, and, for each symbol position, selectively outputting the accumulation value for the symbol position to the accumulator through a selector based on the symbol in the symbol sequence in the symbol position,
wherein a later the position in the symbol sequence, the lower the associated accumulation value.

27. An image sensor, comprising:
a pixel unit array;
a row decoder configured to selectively enable output of a row of pixel units in the pixel unit array;
a processing circuit configured to process output from each pixel unit in the enabled row of pixel units, the processing circuit including:
an analog-to-digital converter (ADC), the ADC including:
a modulator configured to generate a symbol sequence based on the output from the pixel units,
a digital filter configured to filter output of the modulator, the digital filter including:
an operand generator configured to generate operands, a selector configured to selectively output at least one of (1) a reference value and (2) at least one of the operands based on the symbol sequence, and
an accumulator configured to accumulate output from the selector,
wherein the operand generator is configured to generate at least one sequence of operands, each operand associated with a position in the symbol sequence, and each operand represents an accumulation value of the associated position, and
wherein a later the position in the symbol sequence, the lower the associated accumulation value.

28. The image sensor of claim 27, wherein the processing circuit comprises:
a correlated double sample (CDS) circuit associated with each analog-to-digital converter, the CDS configured to perform a CDS operation on output from a unit pixel, and supply output to the associated ADC.

29. The image sensor of claim 27, wherein the processing circuit comprises:
a correlated double sample (CDS) circuit associated with each analog-to-digital converter, the CDS configured to perform a CDS operation on output from the associated ADC.

30. An image processing system, comprising:
a memory;
an image sensor;
at least one interface; and
a processor, the processor configured to control at least one of the image sensor and the memory based on input from the interface; and wherein
the image sensor includes:
a pixel unit array;
a row decoder configured to selectively enable output of a row of pixel units in the pixel unit array;

a processing circuit configured to process output from each pixel unit in the enabled row of pixel units, the processing circuit including:
an analog-to-digital converter (ADC), the ADC including:
a modulator configured to generate a symbol sequence based on the output from the pixel units,
a digital filter configured to filter output of the modulator, the digital filter including:
an operand generator configured to generate operands,
a selector configured to selectively output at least one of (1) a reference value and (2) at least one of the operands based on the symbol sequence, and
an accumulator configured to accumulate output from the selector,
wherein the operand generator is configured to generate at least one sequence of operands, each operand associated with a position in the symbol sequence, and each operand represents an accumulation value of the associated position, and
wherein a later the position in the symbol sequence, the lower the associated accumulation value.

31. A digital filter, comprising:
an operand generator configured to generate operands;
a selector configured to selectively output at least one of (1) a reference value and (2) at least one of the operands based on a symbol sequence; and
an accumulator configured to accumulate output from the selector,
wherein the operand generator is configured to generate at least one sequence of operands, each operand associated with a position in the symbol sequence, and each operand represents an accumulation value of the associated position, and
wherein a later the position in the symbol sequence, the lower the associated accumulation value.

32. A digital filter, comprising:
an accumulation value generator configured to generate at least one sequence of operands, each operand representing an accumulation value for each symbol position in the symbol sequence, and, for each symbol position, selectively outputting the accumulation value for the symbol position to the accumulator through a selector based on the symbol in the symbol sequence in the symbol position,
an accumulator accumulating output from the accumulation value generator,
wherein a later the position in the symbol sequence, the lower the associated accumulation value.

33. A method, comprising:
generating, by an operand generator, a plurality of operand sequences such that a Yth operand value in each operand sequence is greater than a (Y−1)th operand, and such that the Yth operand in an Xth operand sequence is greater than the Yth operand in an (X−1)th sequence, where Y and X are integers greater than or equal to 2;
receiving a symbol sequence from a modulator;
selecting one of (1) a reference value and (2) at least one of the operands based on the symbol sequence; and
accumulating output from the selecting step.

* * * * *